US007312673B2

(12) United States Patent
Wu et al.

(10) Patent No.: US 7,312,673 B2
(45) **Date of Patent: *Dec. 25, 2007**

(54) RADIAL POWER DIVIDER/COMBINER

(75) Inventors: You-Sun Wu, Princeton Junction, NJ (US); Mark Francis Smith, Franklinville, NJ (US); James Norman Remer, Cherry Hill, NJ (US)

(73) Assignee: L-3 Communications Corporation, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/509,160

(22) Filed: Aug. 24, 2006

(65) Prior Publication Data

US 2006/0284701 A1 Dec. 21, 2006

Related U.S. Application Data

(63) Continuation of application No. 11/241,002, filed on Sep. 30, 2005, now Pat. No. 7,113,056, which is a continuation of application No. 10/773,947, filed on Feb. 6, 2004, now Pat. No. 6,982,613.

(51) Int. Cl.
*H01P 5/12* (2006.01)
*H03F 3/68* (2006.01)

(52) U.S. Cl. ...................... 333/137; 333/136; 333/125; 333/127; 330/56; 330/124 R; 330/286; 330/295

(58) Field of Classification Search ................ 333/100, 333/125, 127–128, 136–137; 330/56, 66, 330/124 R, 286, 295
See application file for complete search history.

(56) References Cited

U.S. PATENT DOCUMENTS

| | | | | |
|---|---|---|---|---|
| 3,775,694 A | | 11/1973 | Quine | 330/56 |
| 3,953,702 A | | 4/1976 | Bickel | 219/10.55 |
| 4,097,708 A | | 6/1978 | Bickel | 219/10.55 |
| 4,263,568 A | * | 4/1981 | Nemit | 333/127 |
| 4,562,409 A | | 12/1985 | Saito et al. | 330/386 |

(Continued)

OTHER PUBLICATIONS

Belohoubek, E. et al., “30-Way Radial Power Combiner for Miniature GaAs FET Power Amplifiers”, *IEEE International Microwave Symposium Digest*, 1986, 515-518.
Hicks, C.W. et al., “Spatial Power Combining for Two-Dimensional Structures”, *IEEE Transactions on Microwave Theory and Techniques*, 1998, 46(6), 784-791.

(Continued)

*Primary Examiner*—Barbara Summons
(74) *Attorney, Agent, or Firm*—Woodcock Washburn LLP

(57) ABSTRACT

A radial power divider-combiner is disclosed. The divider-combiner includes a divider and a combiner. An input signal is provided to a transmission antenna that radiates the input signal inside the divider. Within the divider, the input signal is divided into a plurality of individual signals. The individual signals are received by receiving antennas and provided to respective amplifiers. The amplifiers amplify the respective individual signals by a desired amplification factor. The amplified individual signals are provided to a plurality of transmitting antennas within the combiner. Inside the combiner, the amplified individual signals are combined to form an output signal that is received by a receiving antenna in the combiner.

13 Claims, 8 Drawing Sheets

U.S. PATENT DOCUMENTS

| | | | | |
|---|---|---|---|---|
| 4,590,446 | A | 5/1986 | Hsu et al. | 333/125 |
| 4,599,584 | A | 7/1986 | Sasser et al. | 333/125 |
| 4,641,107 | A | 2/1987 | Kalokitis | 330/286 |
| 4,647,869 | A | 3/1987 | Kanelo et al. | 330/286 |
| 4,647,879 | A | 3/1987 | Vaddiparty | 333/127 |
| 4,684,874 | A | 8/1987 | Swift et al. | 333/125 |
| 4,926,145 | A | 5/1990 | Flam et al. | 333/125 |
| 4,933,651 | A | 6/1990 | Benahim et al. | 333/125 |
| 5,128,628 | A | 7/1992 | Marks et al. | 330/66 |
| 5,206,604 | A | 4/1993 | Vaninetti | 330/124 |
| 5,214,394 | A | 5/1993 | Wong | 330/286 |
| 5,256,988 | A | 10/1993 | Izadian | 330/295 |
| 5,838,201 | A | 11/1998 | Sechi | 330/286 |
| 5,920,240 | A | 7/1999 | Alexanian et al. | 333/127 |
| 6,023,612 | A | 2/2000 | Harris et al. | 455/127 |
| 6,037,840 | A | 3/2000 | Myer | 330/295 |
| 6,055,418 | A | 4/2000 | Harris et al. | 455/91 |
| 6,078,222 | A | 6/2000 | Harris et al. | 330/295 |
| 6,242,984 | B1 | 6/2001 | Stores et al. | 330/295 |
| 6,344,777 | B1 | 2/2002 | Ingram et al. | 330/295 |
| 6,420,935 | B1 | 7/2002 | Harris et al. | 330/295 |
| 6,507,243 | B2 | 1/2003 | Harris et al. | 330/129 |
| 6,982,613 | B2 | 1/2006 | Wu et al. | 333/137 |
| 7,113,056 | B2 * | 9/2006 | Wu et al. | 333/137 |

OTHER PUBLICATIONS

Lunden, O-P, et al., "Power Combining of Ku-band Active Dipoles in a Cylindrical Resonant Cavity", *IEEE MTT-S Digest*, 1995, 701-704.

Peterson, D.F., "Radial-Symmetric *N*-Way TEM-Line IMPATT Diode Power Combining Arrays", *IEEE Transactions on Microwave Theory and Techniques*, Feb. 1982, 30(2), 163-173.

Saleh, A.A. et al., "Planar Electrically Symmetric *n*-Way Hybrid Power Dividers/Combiners", *IEEE Transactions on Microwave Theory and Techniques*, Jun. 1980, 28(6), 555-563.

York, R.A., "Some Considerations for Optimal Efficiency and Low Noise in Large Power Combiners", *IEEE Transactions on Microwave Theory and Techniques*,2001, 49(8), 1477-1482.

Jia, P.C. et al., "Multioctave Spatial Power Combining in Oversized Coaxial Amplifier", *IEEE International Microwave Theory and Techniques*, 2002, 50(5), 1355-1360.

Ortiz, S. et al., "A 25 Watt and 50 Watt Ka-Band Quasi-Optical Amplifier", *IEEE International Symposium*, Jun. 2000, Boston, Ma.

Bialkowski, M.E. et al., "Modelling and Testing of Radial Divider/Combiners", *IEEE*, 1994, 1, 234-240, XP 010149899.

Bialkowski, M.E., "Analysis of a Planar M-Way Radial Waveguide Combiner/Divider for the Case of Arbitrary Excitation", *Conference Proceedings Article*, Aug. 1993, 1, 213-218, XP 010224190.

Chen, Y-J. et al., "A Wide-Band Multiport Planar Power-Divider Design using Matched Sectorial Components in Radial Arrangement", *IEEE Transactions on Microwave Theory and Techniques*, 1998, 46(8), 1072-1078, XP 000771938.

* cited by examiner

| Parameter | Isolation | Parameter | Isolation |
|---|---|---|---|
| S12 | -32.00 dB | S17 | -8.13 dB |
| S13 | -22.00dB | S18 | -8.73 dB |
| S14 | -9.15 dB | S19 | -21.80 dB |
| S15 | -8.00 dB | S1,10 | -27.91 dB |
| S16 | -10.18 dB | | |

FIG. 6

RADIAL POWER DIVIDER/COMBINER

CROSS-REFERENCE TO RELATED APPLICATIONS

This application is a continuation of U.S. patent application Ser. No. 11/241,002, filed Sep. 30, 2005, now U.S. Pat. No. 7,113,056, which is a continuation of U.S. patent application Ser. No. 10/773,947, filed Feb. 6, 2004, now U.S. Pat. No. 6,982,613. The disclosures of each of the above-referenced U.S. patent applications are incorporated herein by reference.

FIELD OF THE INVENTION

Generally, the invention relates to radial power divider/combiners. In particular, the invention relates to radial power divider/combiners that are suitable for use in solid-state power-amplifier modules.

BACKGROUND OF THE INVENTION

Solid-state power-amplifier modules (SSPAs) have a variety of uses. For example, SSPAs may be used in satellites to amplify severely attenuated ground transmissions to a level suitable for processing in the satellite. SSPAs may also be used to perform the necessary amplification for signals transmitted to other satellites in a crosslink application, or to the earth for reception by ground based receivers. SSPAs are also suitable for ground-based RF applications requiring high output power.

Typical SSPAs achieve signal output levels of more than 10 watts. Because a single amplifier chip cannot achieve this level of power without incurring excessive size and power consumption, modern SSPA designs typically use a radial splitting and combining architecture in which the signal is divided into a number of individual parts. Each individual part is then amplified by a respective amplifier. The outputs of the amplifiers are then combined into a single output that achieves the desired overall signal amplification.

Additionally, a typical power-combiner, such as the in-phase Wilkinson combiner or the 90-degree branch-line hybrid, in which a number of binary combiners are cascaded, becomes very lossy and cumbersome when the number of combined amplifiers becomes large. For example, to combine eight amplifiers using a conventional, binary microstrip branch-line hybrid at Ka-band (~26.5 GHz), the combiner microstrip trace tends to be about six inches long and its loss tends to exceed 3 dB. It should be understood that a 3-dB insertion loss means that half of the RF power output is lost. Such losses are unacceptable for most applications.

To overcome these loss and size problems, many approaches, including the stripline radial combiner, oversized coaxial waveguide combiner, and quasi-optical combiner, have been investigated. The stripline radial combiner, using multi-section impedance transformers and isolation resistors, still suffers excessive loss at Ka-band, mainly because of the extremely thin substrate (<10 mil) required at Ka-band. The coaxial waveguide approach uses oversized coaxial cable, which introduces moding problems and, consequently, is useful only at low frequencies. The quasi-optical combiner uses hard waveguide feed horns at both the input and output to split and combine the power. The field distribution of a regular feed horn is not uniform, however, with more energy concentrated near the beam center. To make field distribution uniform, these waveguide feed horns require sophisticated dielectric loading and, consequently, become very large and cumbersome.

It would be desirable, therefore, if there were available low-loss, low-cost, radial power divider/combiners that could be used in designing high-frequency (e.g., Ka-band) SSPAs.

SUMMARY OF THE INVENTION

A radial power divider/combiner according to the invention is not only low-loss, but also broadband. Because simple milling technology may be used to fabricate the divider/combiner, it can be mass produced with high precision and low cost.

Unlike conventional binary combiners that can only combine N amplifiers with $N=2^n$, a radial power combiner according to the invention can combine any arbitrary number of amplifiers. Further, the diameter of the radial combiner may be as small as 4.5 inches for Ka-band signals, which is relatively small compared with other approaches such as waveguide feed horns or the oversized coaxial waveguide approach. The radial divider/combiner of the invention can be made small in size and light in weight, which makes it suitable for the high frequency, high power, solid state power amplifiers (SSPAs) used in many space and military applications.

If desired to meet specific system requirements, the divider or the combiner may be used separately, that is, it is not necessary to use them as a pair. For example, it is possible to use a stripline divider to drive the amplifier stage of an SSPA and use the low-loss radial combiner of the invention to bring the amplified signals together into a single high-power output.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, it being understood, however, that the invention is not limited to the specific apparatus and methods disclosed. In the drawings, wherein like numerals indicate like elements:

FIG. 6 provides a table of isolation measurements from a first port to each adjacent port in an example embodiment of a radial combiner according to the invention.

DETAILED DESCRIPTION OF ILLUSTRATIVE EMBODIMENTS

Figure 1:
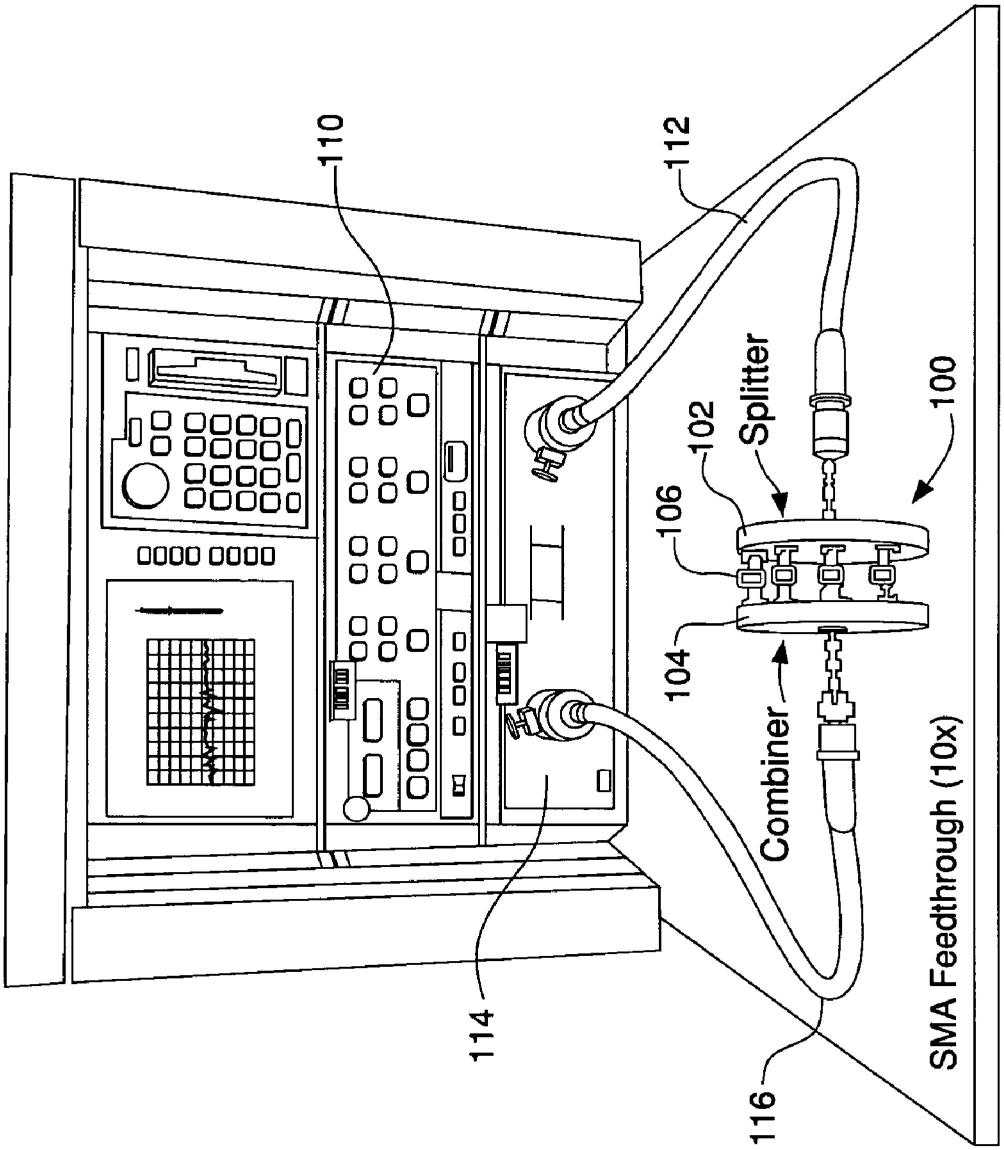
FIG. 1 depicts an example embodiment of a radial divider-combiner according to the invention.

FIG. 1 depicts an example embodiment of a radial divider-combiner 100 according to the invention. As shown, the radial divider-combiner 100 includes a divider 102 and a combiner 104. A signal generator 110 provides to the divider 102 an input signal having an amplitude and frequency. The input signal may or may not be modulated. As shown, the signal generator 110 may be a test device or simulator, for example, that provides the input signal to the divider 102 via a coaxial cable 112. In operation, the signal generator 110 may be any device that provides a signal to the radial divider-combiner 100. The coaxial cable 112 may be attached to the divider 102 via a connector, such as an SMA connector, for example.

Inside the divider 102, the input signal is divided into a plurality, N, of individual signals. Each individual signal has roughly the same amplitude and frequency as the input signal. The individual signals are provided to respective amplifiers 106. The amplifiers 106, which may be solid-state PHEMT amplifiers, for example, amplify the respective individual signals by a desired amplification gain G, which may be in the range of about 20 to 100 dB, for example. Matched amplifiers are preferred in order to keep the individual signals in-phase (so that they combine constructively). Cooling hoses (not shown) may also be used to provide a cooling fluid, such as water, for example, to cool the amplifiers.

The amplified individual signals are provided to the combiner 104. Inside the combiner 104, the amplified individual signals are combined to form an output signal. Not accounting for any losses that might occur within the divider-combiner, the amplitude of the output signal would be, therefore, about N times the amplitude of the amplified input signals, and about NG times the amplitude of the input signal, where G is the linear gain of the amplifier. The output signal may then be provided to a signal receiver 114. As shown, the signal receiver 114 may be a test device, such as a spectrum analyzer, for example. In operation, the signal receiver 114 may be any device that receives the output signal from the radial divider-combiner 100. The output signal may be provided to the signal receiver 114 via a coaxial cable 116. The coaxial cable 116 may be attached to the combiner 104 via a connector, such as an SMA connector, for example.

Figure 2:
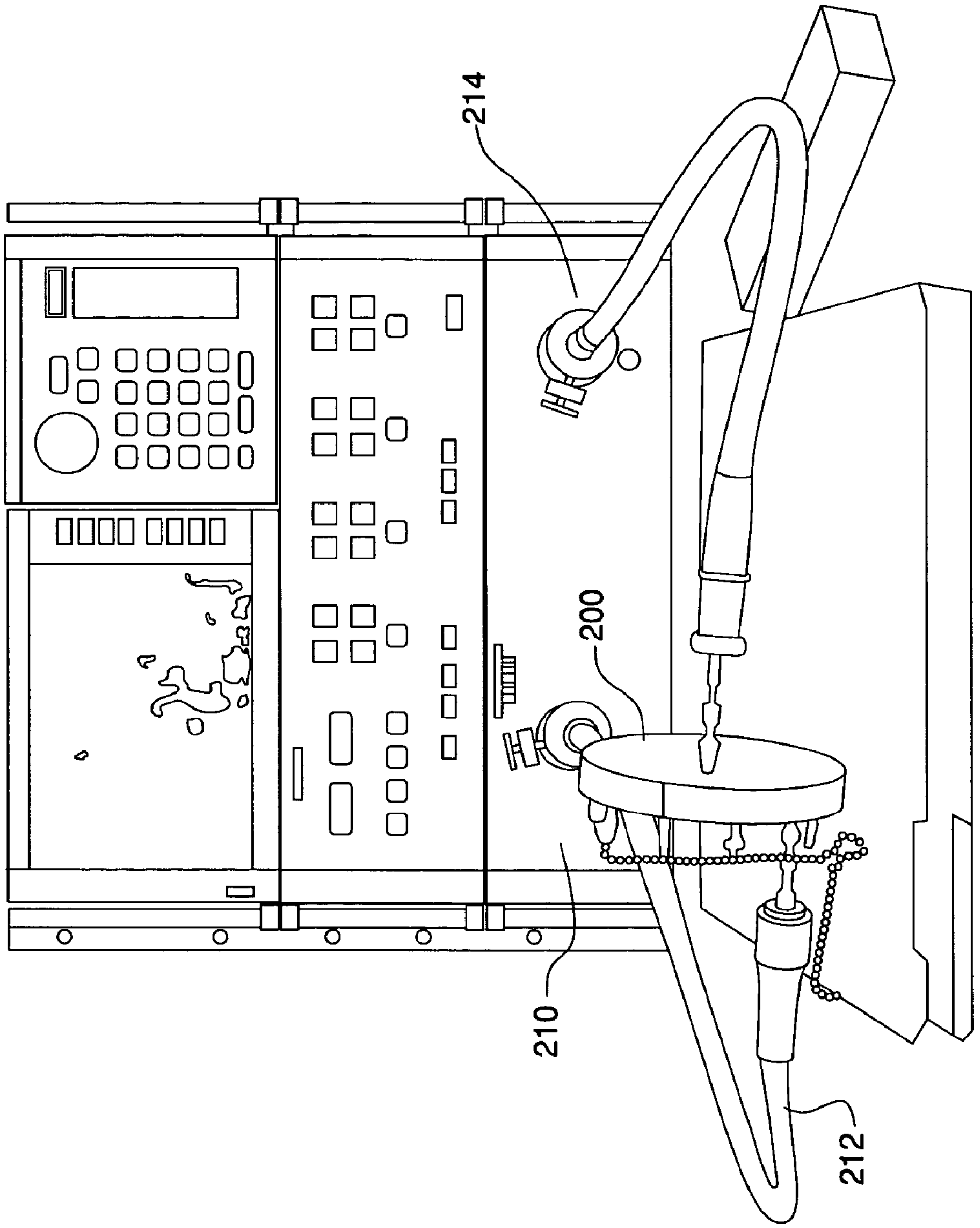
FIG. 2 depicts an example embodiment of a radial divider according to the invention.

FIG. 2 depicts an example embodiment of a radial divider/combiner according to the invention. As will be described in detail below, a divider/combiner may be set up as either a divider or a combiner depending on the direction of signal flow. As used throughout this specification, the term “divider-combiner” is meant to refer to a device that includes both a divider and a combiner, such as the device 100 shown in FIG. 1, for example. Similarly, the term “divider/combiner” is meant to refer to a device that may be used as either a divider or combiner, such as the device 200 shown in FIG. 2, for example.

As shown in FIG. 2, the divider/combiner 200 is set up as a divider. A signal generator 214 provides an input signal to the divider 200. As shown, the signal generator 214 may be a test device or simulator, for example, that provides the input signals to the divider 200 via a coaxial cable 216. The cable 216 may be attached to the divider 200 via a connector, which may be an SMA connector, for example.

Inside the divider 200, the input signals are divided to form N output signals. One or more output signals may then be provided to a signal receiver 210. As shown, the signal receiver 210 may be a test device, such as a spectrum analyzer, for example. An output signal from a selected port, for example, may be provided to the signal receiver 210 via a coaxial cable 212. The coaxial cable 212 may be attached to the divider 200 via a connector, such as an SMA connector, for example.

FIGS. 3A-3D depict details of an example embodiment of an N-way radial divider/combiner 200 according to the invention. The divider/combiner 200 will be described in connection with its functionality as a divider, though it should be understood that, by reversing signal direction, the divider/combiner may function as a combiner.

Figure 3B:
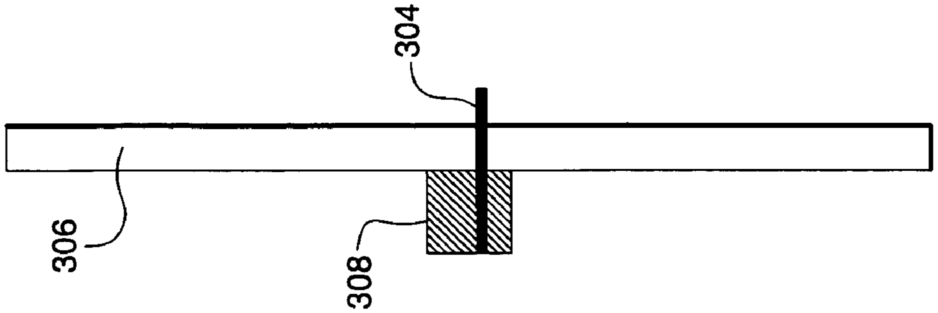
FIGS. 3A through 3D depict details of an example embodiment of a radial divider/combiner according to the invention.
Figure 3A:
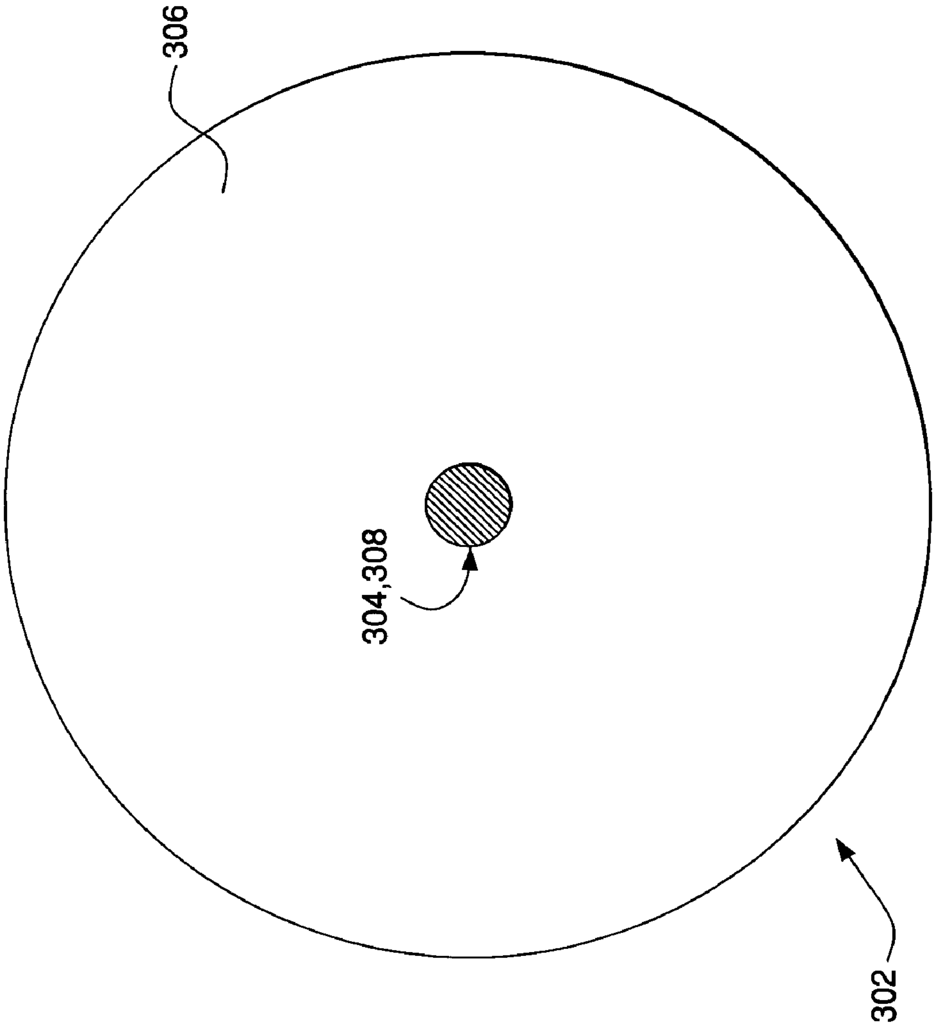

FIGS. 3A and 3B depict a cover 302 for a divider/combiner 300 according to the invention. A transmitting antenna 304, which may be a coaxial pin monopole antenna, for example, is disposed at the center of a cover plate 306. The antenna 304 extends through the cover plate 306 into an interior region of the divider 300, and may be secured to the cover plate 306 via a connector 308, which may be an SMA connector, for example. Preferably, the transmitting antenna 304 is omni-directional. That is, the transmitting antenna 304 preferably radiates the input signal uniformly over 360° in the azimuth ground plane of the divider 300. Preferably, to avoid shorting the antenna 304, the antenna 304 preferably does not extend into the interior region of the divider 300 so far that the antenna 304 contacts the base 310 (see FIGS. 3C-D) when the cover 302 and base 310 are attached to each other. The transmitting antenna 304 may be custom trimmed using a standard SMA coaxial-pin panel connector.

Figure 3D:
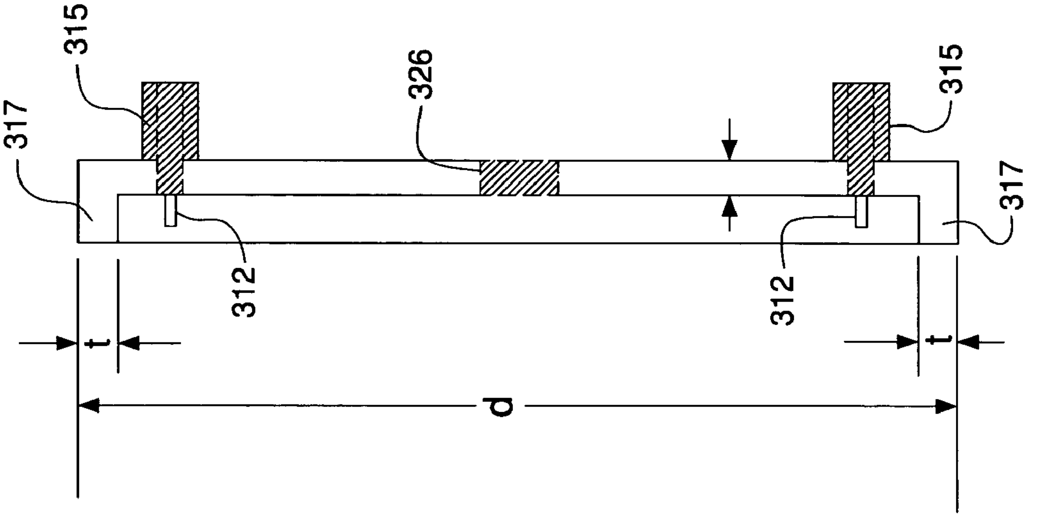
Figure 3C:
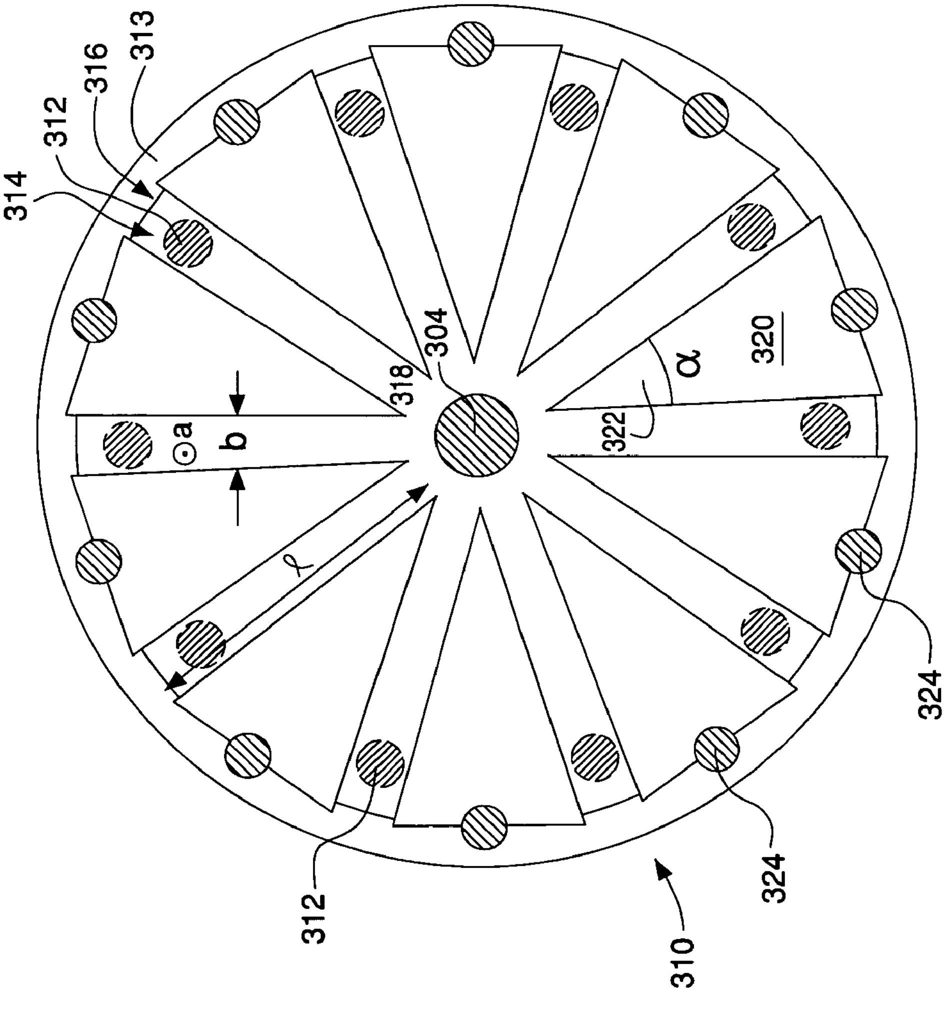

FIGS. 3C and 3D depict a base 310 for a divider/combiner 300 according to the invention. A plurality of receiving antennas 312 are disposed around the periphery of the base 310. The receiving antennas 312 extend through the base plate 313 into the interior region of the divider 300. Again, to avoid shorting the antennas 312, the antennas 312 preferably do not extend into the interior region of the divider 300 so far that the antennas 312 contact the cover 302 (see FIGS. 3A-B) when the cover 302 and base 310 are attached to each other. The receiving antennas 312 may be custom trimmed using standard SMA coaxial-pin panel connectors 315.

Though the transmitting antenna is described herein as being located on the cover and the receiving antennas are described as being located on the base, it should be understood that the transmitting antenna may be located on the base and the receiving antennas may be located on the cover. Alternatively, all of the antennas, both transmitting and receiving, may be located on either the cover or the base. Generally, it should be understood that any or all of the antennas may be located on either substrate (i.e., on either the base or the cover).

As shown, each receiving antenna 312 is disposed near a respective end 314 of a respective waveguide 316. The waveguides 316 are disposed in a radial configuration around the transmitting antenna 304 such that at least a portion of the input signal radiated by the antenna 304 enters an input end 318 of each waveguide 316.

Alternatively, receiving antennas may be placed on concentric rings located inside the outer ring of receiving antennas described above. These additional receiving antennas may be located inside the waveguides at a distance equal to $n\lambda$ from the outer ring of antennas, where n is an integer and $\lambda$ is the wavelength of the input signal.

The dimensions of the waveguides 316 are chosen to optimize propagation of the input signal along the waveguides 316, and also so that the signals received by the receiving antennas 312 may be combined constructively. Preferably, each waveguide 316 has a length, 1, a width, b, and a depth, a (into the sheet of FIG. 3C). Preferably, the dimensions 1, a, and b are chosen in such a way that only the single dominant $TE_{1,0}$ mode is propagating inside the waveguide. Typically, the waveguide width b is within the range $2b>\lambda>b$, where $\lambda$ is the wavelength of the input signal.

Preferably, the depth, a, is chosen to be about ½ the width, b. For example, the width b, may be chosen to equal the broad dimension of a standard fundamental mode ($TE_{1,0}$) waveguide used for the desired frequency. For example, at 26.5 GHz, the desired waveguide is WR-34, with the broad dimension b=0.34 inches.

Preferably, the base 310 is monolithic. That is, the inside surface of the base 310 may be formed from a single piece of material. Any conductive, low-loss material may be used, such as aluminum, brass, copper, silver, or a metal-coated plastic, for example. The waveguides 316 may be milled away from a cylindrical piece of material, leaving a plurality of wedges 320. The wedges 320, as shown in FIG. 3C, are disposed radially about the center of the base 310, and define the waveguides 316 therebetween. To minimize reflection within the divider 300 (and, thus, to minimize loss of signal power), it is desirable that the vertexes 322 of the wedges 320 be as sharp as possible (i.e., that the vertex of angle $\alpha$ between input ends 318 of adjacent waveguides 316 not be rounded or chamfered).

The cover 302 may be secured to the base 310 via a plurality of screws or other such securing devices. For that purpose, screw holes 324 may be drilled through the base 310 at various locations. As shown in FIG. 3C, for example, screw holes 324 are disposed radially around the periphery of the base 310. Preferably, the screw holes 324 are drilled through the wedges 320 and base plate 314, as shown, so that the screws do not interfere with signal propagation through the waveguides 316.

Though a 10-way divider/combiner has been depicted for illustrative purposes, it should be understood that any number, N, of waveguides may be provided, depending on the application. It is expected that N will typically be in the range of two to 100. A ten-way power divider/combiner has been described to illustrate the point that, in contrast with conventional binary combiners, which are limited to $N=2^n$ individual signals, where n is an integer, any integer number of individual signals may be used with the radial divider/combiner of the invention.

Additionally, in a traditional radial cavity combiner that has no partition wedges, the cavity usually will resonate at $TM_{m,n}$ modes, causing sharp mismatches between the transmitting and receiving antennas. The partition wedges of the invention separate the receiving antennas from each other and thus eliminate such cavity resonances. As a result, even though the radial combiner of the invention has the outside look of a circular cavity, it shows little, if any, cavity resonances.

In an example embodiment of the invention, the base 310 may have a diameter, d, of about 4.5 inches. The walls 317 of the base may have a thickness of about ¼ inch.

A divider/combiner according to the invention may operate in a vacuum. Operation in air has been found to yield acceptable results for high-frequency applications. For low-frequency applications, where the wavelength, $\lambda$, of the input signal is long (and, therefore, the lengths of the waveguide long), it may be desirable to fill the waveguides with a dielectric material, such as a plastic, for example. Such a dielectric filling would enable smaller waveguides because the effective wavelength, $\lambda_{eff}$, of the signal propagating through the dielectric is inversely proportional to the square-root of the dielectric constant (i.e., $\lambda_{eff}=\lambda\cdot\eta^{-1/2}$, where $\lambda$ is the wavelength in vacuum and $\eta$ is the dielectric constant).

Figure 4:
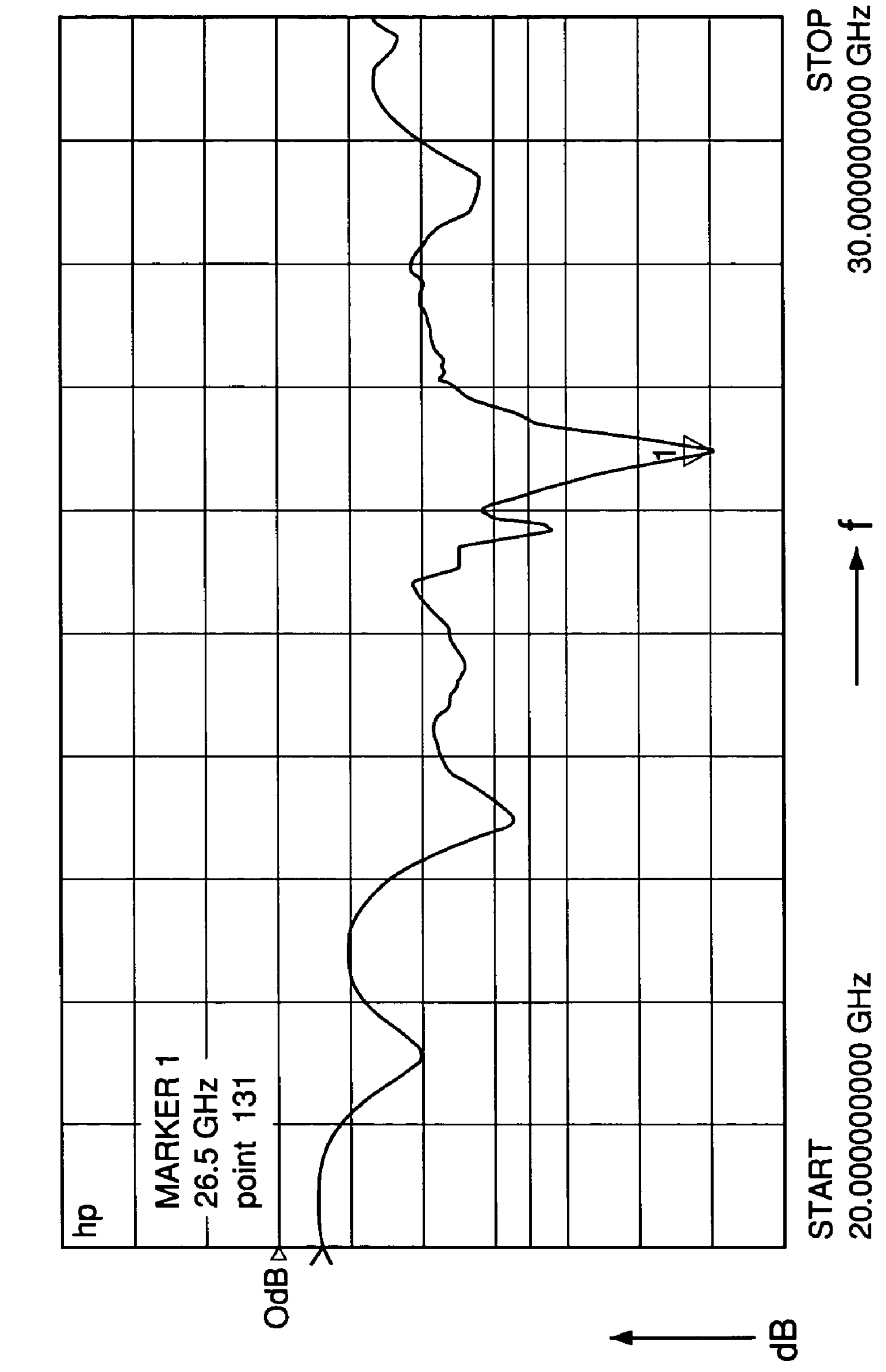
FIG. 4 provides a plot of input reflection loss for an example embodiment of a radial combiner according to the invention.

FIG. 4 provides a plot of input reflection loss for an example embodiment of a radial combiner according to the invention. Specifically, FIG. 4 shows the measured input return loss of the transmitting antenna at the center port. Input loss was measured using input signals from 20 to 30 GHz. The vertical scale is reflection loss in 5 dB per division and the 0 dB reference is the 3rd horizontal line from the top. As shown, the input return loss of the center port is better than 30 dB at 26.5 GHz.

Figure 5:
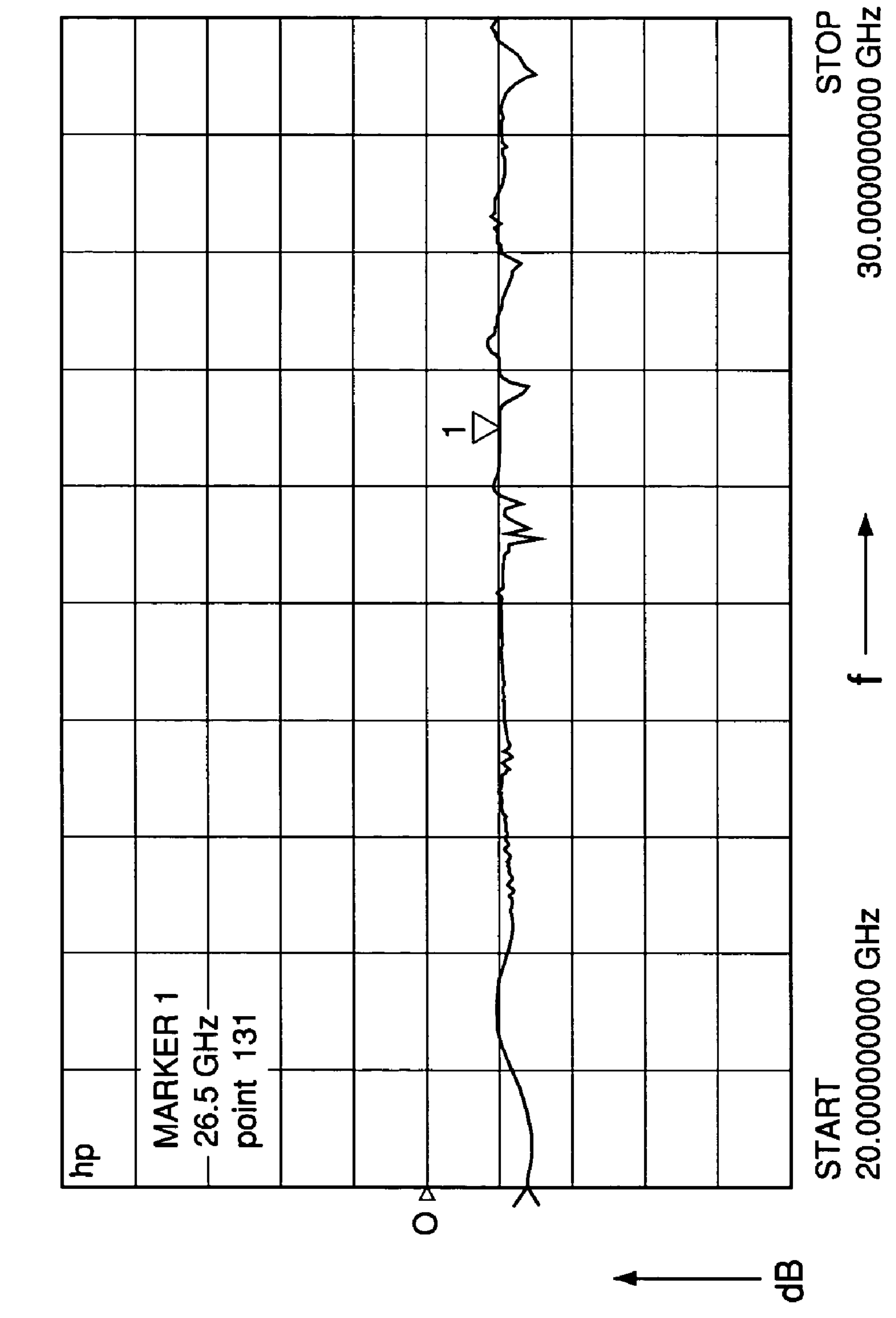
FIG. 5 provides a plot of coupling from the input port of an example embodiment of a radial divider according to the invention to a selected output port.

FIG. 5 provides a plot of coupling from the input port to a selected output port of an example embodiment of a radial divider according to the invention. To demonstrate the power dividing function, insertion loss from the transmitting center port to each of ten output ports was measured using input signals from 20 to 30 GHz. In FIG. 5, the horizontal scale is swept from 20 to 30 GHz and the vertical scale is 10 dB per division. The 0 dB reference is the 5th horizontal (center) line from the top. FIG. 5 shows that the measured insertion loss from the center port to port #9 is −10.35 dB. This result indicates that the output power of each port is about 10% (i.e., −10 dB) of the input port power. The extra 0.35 dB is due to conductor loss of the radial waveguide.

FIG. 6 provides a table of isolation measurements from a first port to each adjacent port in an example embodiment of a radial combiner according to the invention. The table provides the measured isolation of a 10-way combiner from port 1 to each adjacent port, with all unused ports terminated. As used in the table, the parameter "S1x" indicates a measurement from port 1 to port x. The data indicates that the combiner has good isolation (e.g., >20 dB) between immediate neighboring ports (e.g., S12 and S1,10). Between direct-facing ports, such as S15 and S16, the isolation drops to about 8 dB. Selecting designs with an odd number of ports provides better isolation to address this issue.

Figure 7:
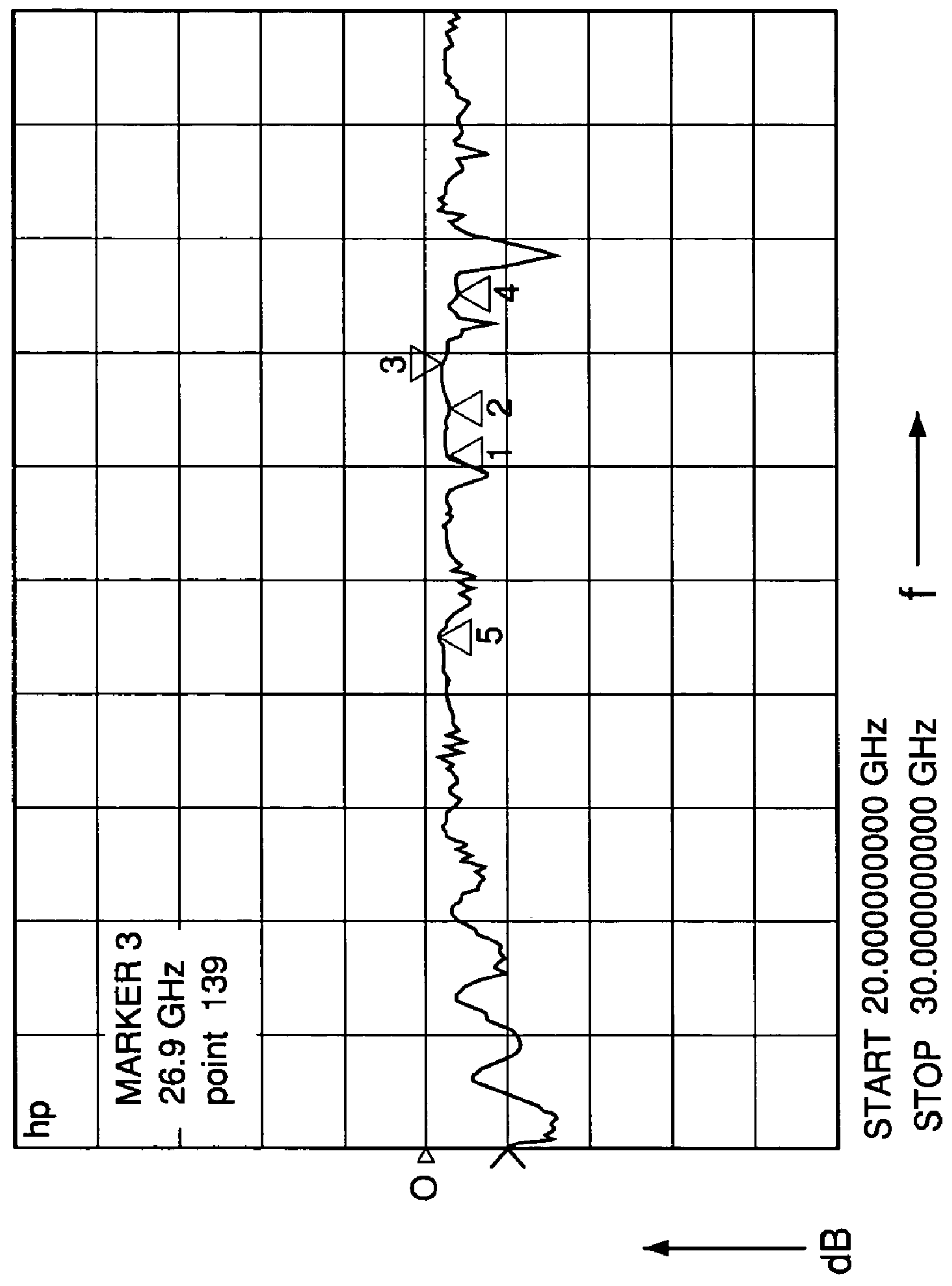
FIG. 7 provides a plot of insertion loss for an example embodiment of a radial divider-combiner according to the invention.

FIG. 7 provides a plot of insertion loss for an example embodiment of a radial divider-combiner according to the invention. To measure the net insertion loss of the power divider-combiner, two radial divider/combiners were connected back-to-back, as shown in FIG. 1, without amplifiers, using ten SMA male-to-male adapters. The overall insertion loss of the power divider-combiner was measured using input signals from 20 to 30 GHz. As shown in FIG. 7, the horizontal scale is from 20 to 30 GHz and the vertical scale is the insertion loss (S21) in 5 dB per division. The 0 dB reference is the 5th (center) line from the top. These data demonstrate a total loss of less than 2 dB (individual loss of less than 1 dB) from 23 to 27 GHz. At 26.5 GHz, the total loss was 1.41 dB. As the radial combiner loss is half of the total divider-combiner loss, the loss for the combiner alone is, therefore, 0.71 dB at 26.5 GHz. The divider-combiner insertion loss data show that the radial power divider-combiner of the invention is not only low-loss, but is also quite broad-band.

Thus there have been described radial power divider/combiners that are particularly suitable for use in solid-state power-amplifier modules. Those skilled in the art will appreciate that numerous changes and modifications may be made to the preferred embodiments of the invention and that such changes and modifications may be made without departing from the spirit of the invention. For example, for better impedance matching and less loss, the waveguides may be tapered such that at least one of the width, b, and depth a, is not constant along the length, 1, of the waveguide. It is therefore intended that the appended claims cover all such equivalent variations as fall within the true spirit and scope of the invention.

What is claimed:

1. A radial power divider/combiner comprising:

a base having a center, the base defining a wedge portion having a pointed vertex at an end thereof;

a first antenna disposed near the center of the base;

a waveguide comprising a groove in the base, the groove extending along the wedge portion; and a second antenna disposed near a peripheral end of the waveguide, wherein the first antenna extends from the base in a first direction that is generally perpendicular to the base and the second antenna extends in the first direction from the base.

2. The radial power divider/combiner of claim 1, wherein the first antenna is adapted to receive a signal and to transmit the received signal through the waveguide to the second antenna.

3. The radial power divider/combiner of claim 1, wherein the second antenna is adapted to receive a signal transmitted through the waveguide.

4. The radial power divider/combiner of claim 3, wherein the second antenna is electrically coupled to an amplifier, and is adapted to provide the received signal to the amplifier.

5. The radial power divider/combiner of claim 1, wherein the second antenna is adapted to transmit a signal through the waveguide to the first antenna.

6. The radial power divider/combiner of claim 5, wherein the second antenna is electrically coupled to an amplifier, and is adapted to receive the signal from the amplifier.

7. A radial power divider/combiner comprising:

a base having a center, the base defining a wedge portion having a pointed vertex at an end thereof;

a first antenna disposed near the center of the base;

a waveguide comprising a groove in the base, the groove extending along the wedge portion;

a second antenna disposed near a peripheral end of the waveguide; and a cover secured to the base, wherein the first antenna extends from the base in a first direction that is generally perpendicular to the base and the second antenna extends from the cover in a second direction that is generally perpendicular to the cover.

8. The radial power divider/combiner of claim 7, wherein the base and the cover define an interior region of the divider/combiner, and wherein each of the first antenna and the second antenna extends into the interior region of the divider/combiner.

9. The radial power divider/combiner of claim 7, wherein the first antenna is adapted to receive a signal and to transmit the received signal through the waveguide to the second antenna.

10. The radial power divider/combiner of claim 7, wherein the second antenna is adapted to receive a signal transmitted through the waveguide.

11. The radial power divider/combiner of claim 10, wherein the second antenna is electrically coupled to an amplifier, and is adapted to provide the received signal to the amplifier.

12. The radial power divider/combiner of claim 7, wherein the second antenna is adapted to transmit a signal through the waveguide to the first antenna.

13. The radial power divider/combiner of claim 12, wherein the second antenna is electrically coupled to an amplifier, and is adapted to receive the signal from the amplifier.

* * * * *